United States Patent
Nomura

(10) Patent No.: US 8,779,756 B2
(45) Date of Patent: Jul. 15, 2014

(54) CURRENT SENSOR

(75) Inventor: Kousuke Nomura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 258 days.

(21) Appl. No.: 13/097,152

(22) Filed: Apr. 29, 2011

(65) Prior Publication Data

US 2011/0285384 A1    Nov. 24, 2011

(30) Foreign Application Priority Data

May 19, 2010    (JP) .................................. 2010-115214

(51) Int. Cl.
G01R 15/20    (2006.01)
(52) U.S. Cl.
USPC ...................................... 324/117 R; 324/144
(58) Field of Classification Search
CPC .... G01R 15/205; G01R 33/093; G01R 33/06; G01D 5/16
USPC ......................................................... 324/117
See application file for complete search history.

(56) References Cited

U.S. PATENT DOCUMENTS

| | | | | |
|---|---|---|---|---|
| 6,316,931 B1* | 11/2001 | Nakagawa et al. | ....... | 324/117 R |
| 6,323,634 B1* | 11/2001 | Nakagawa et al. | ....... | 324/117 R |
| 7,839,605 B2* | 11/2010 | Parker | ........................... | 360/318 |
| 2009/0023345 A1* | 1/2009 | Matsumoto et al. | .......... | 439/720 |

FOREIGN PATENT DOCUMENTS

| | | |
|---|---|---|
| JP | 11-72514 A | 3/1999 |
| JP | 2001-116773 A | 4/2001 |
| JP | A-2007-155399 | 6/2007 |
| JP | A-2008-215970 | 9/2008 |

OTHER PUBLICATIONS

Takashi—JP2008-215970 Machine Translation, JPO, p. 1-20.*
Akiyuki—JP2007-155399 Machine Translation, JPO, p. 1-7.*
Suzuki, JP 2001-116773A, Machine Translation by JPO, p. 1-15.*
Office Action mailed Dec. 3, 2013 issued in corresponding JP patent application No. 2010-115214 (and English translation).

* cited by examiner

*Primary Examiner* — Thomas F Valone
(74) *Attorney, Agent, or Firm* — Posz Law Group, PLC

(57) ABSTRACT

A current sensor for detecting a first electric current flowing through a current path includes a sensor chip, a coil, a current control circuit, and an output circuit. The sensor chip includes a magnetoresistive element and is adopted to be located near the current path. The coil applies a bias magnetic field to the magnetoresistive element. The current control circuit supplies a second electric current to the coil. The second electric current periodically changes in polarity. The output circuit outputs a difference between a first voltage and a second voltage. The first voltage is generated by the magnetoresistive element, when the second electric current flowing through the coil has a positive polarity. The second voltage is generated by the magnetoresistive element, when the second electric current flowing through the coil has a negative polarity.

8 Claims, 10 Drawing Sheets

CURRENT SENSOR

CROSS REFERENCE TO RELATED APPLICATION

This application is based on and claims priority to Japanese Patent Application No. 2010-115214 filed on May 19, 2010, the contents of which are incorporated herein by reference.

FIELD OF THE INVENTION

The present invention relates to a current sensor for detecting an electric current by using a magnetoresistive element and a bias magnetic field.

BACKGROUND OF THE INVENTION

As disclosed in, for example, JP-A-2007-155399, a conventional current sensor includes a sensor chip having a magnetoresistive element, a bias magnet located on both sides of the sensor chip, and a processing unit for calculating the magnitude of an electric current flowing through a current path based on a voltage generated by the sensor chip. A resistance of the magnetoresistive element changes according to a direction of a vector of a combined magnetic field of a magnetic field generated by the bias magnet and a magnetic field generated by the electric current flowing through the current path. The processing unit calculates the magnitude of the electric current based on the voltage generated by the magnetoresistive element.

In such a conventional current sensor, if there is a misalignment between the sensor chip and the bias magnet, an output voltage of the sensor chip has an offset. The offset reduces the accuracy with which the electric current is detected. Also, such an offset can occur due to the mismatch in resistance between the magnetoresistive elements of a bridge circuit and due to age deterioration of the sensor chip and the bias magnet.

SUMMARY OF THE INVENTION

In view of the above, it is an object of the present invention to provide a current sensor for preventing a reduction in current detection accuracy due to an offset in an output voltage of a sensor chip.

According to an aspect of the present invention, a current sensor for detecting a first electric current flowing through a current path includes a sensor chip, a coil, a current control circuit, and an output circuit. The sensor chip includes a magnetoresistive element and is adopted to be located near the current path. The coil applies a bias magnetic field to the magnetoresistive element. The current control circuit supplies a second electric current to the coil. The second electric current periodically changes in polarity. The output circuit outputs a difference between a first voltage and a second voltage. The first voltage is generated by the magnetoresistive element, when the second electric current flowing through the coil has a positive polarity. The second voltage is generated by the magnetoresistive element, when the second electric current flowing through the coil has a negative polarity. Preferably, the sensor chip can be located inside the coil. Preferably, the sensor chip and the coil can be positioned relative to each other in such a manner that a first plane including an easy magnetization axis of the magnetoresistive element is parallel to a second plane including a center axis of the coil. Preferably, the sensor chip further can include a substrate having an element region where the magnetoresistive element is located, and the sensor chip and the coil can be positioned relative to each other in such a manner that the center axis of the coil passes through the element region of the sensor chip. Preferably, the sensor chip and the coil are positioned relative to each other in such a manner that a center of the sensor chip coincides with a center of the coil. Preferably, the current sensor further includes a magnetic core located inside the coil.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 1:
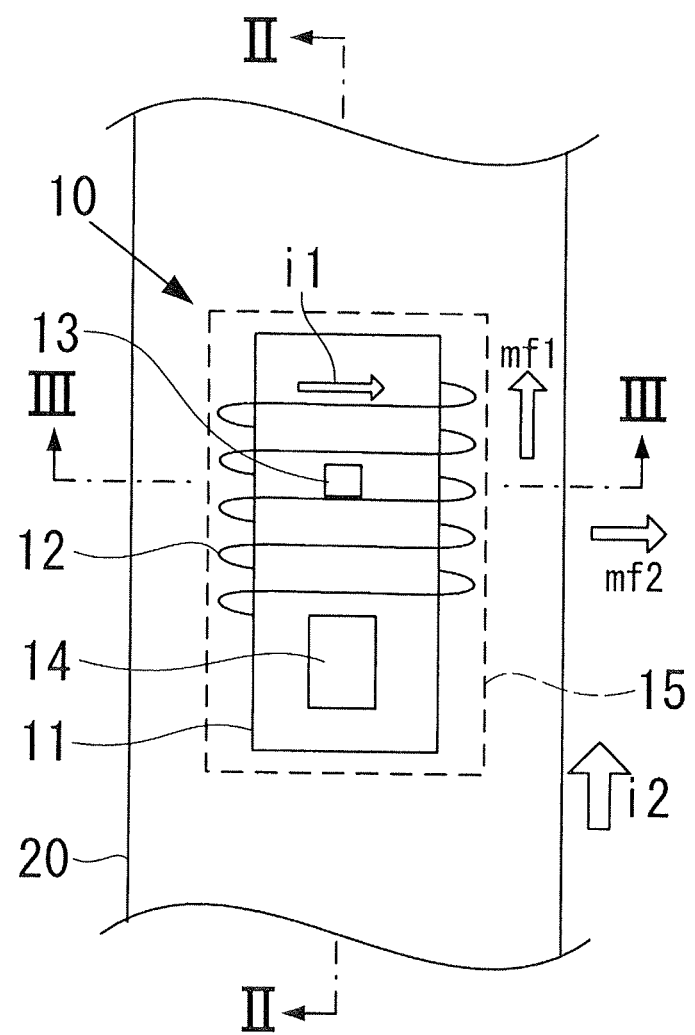
FIG. 1 is a diagram illustrating a plan view of a current sensor according to a first embodiment of the present invention.

Embodiments of the present invention are described below with reference to the drawings. Throughout the embodiments, the same symbols are given to the same or corresponding parts in the drawings.

First Embodiment

Figure 2:
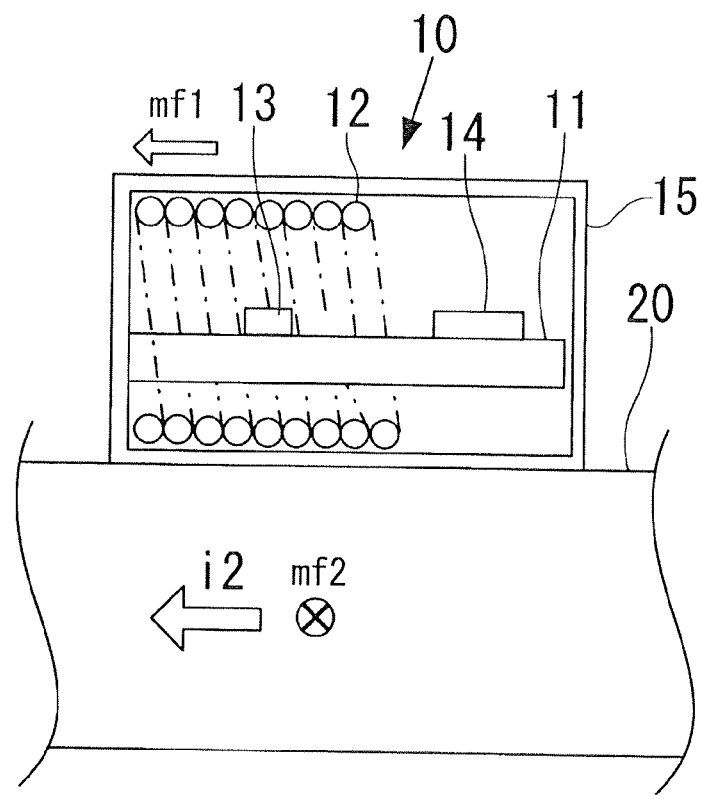
FIG. 2 is a diagram illustrating a cross-sectional view taken along the line II-II in FIG. 1.
Figure 3:
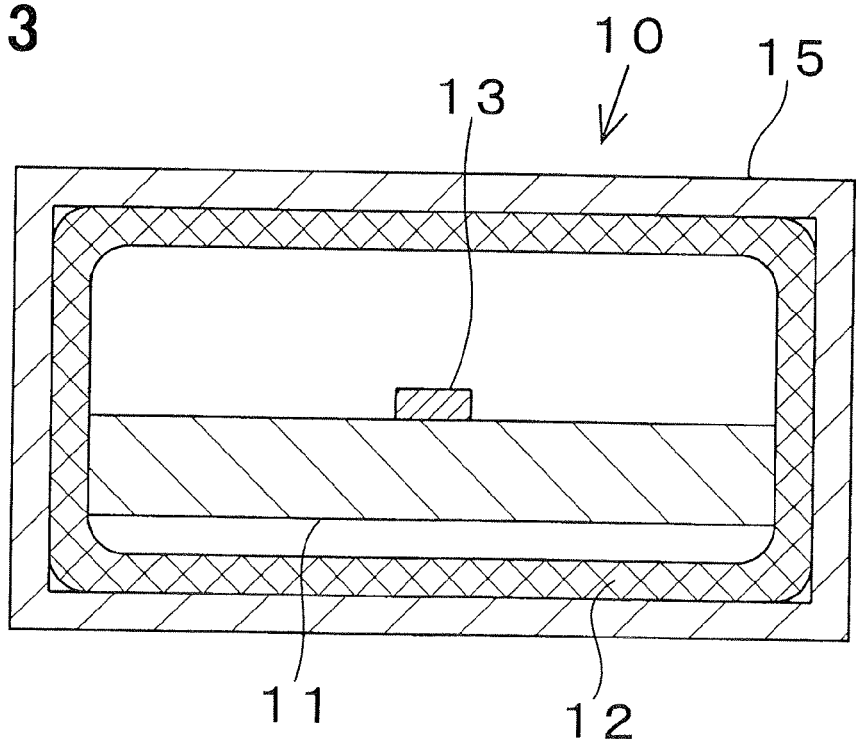
FIG. 3 is a diagram illustrating a cross-sectional view taken along the line in FIG. 1.
Figure 4A:
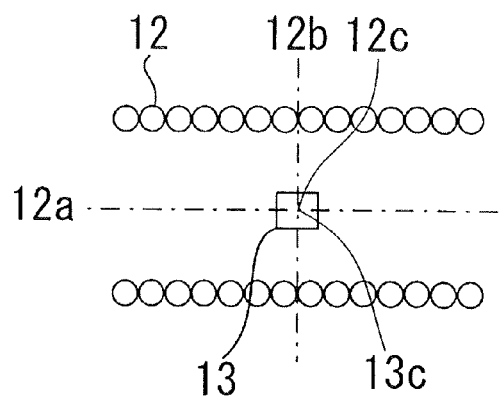
FIG. 4A is a diagram illustrating a positional relationship between a sensor chip and a coil of the current sensor.
Figure 4B:
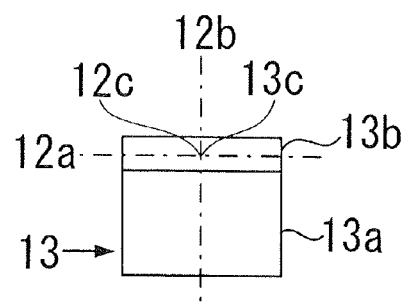
FIG. 4B is a diagram illustrating a vertical cross-sectional view of the sensor chip.
Figure 5:
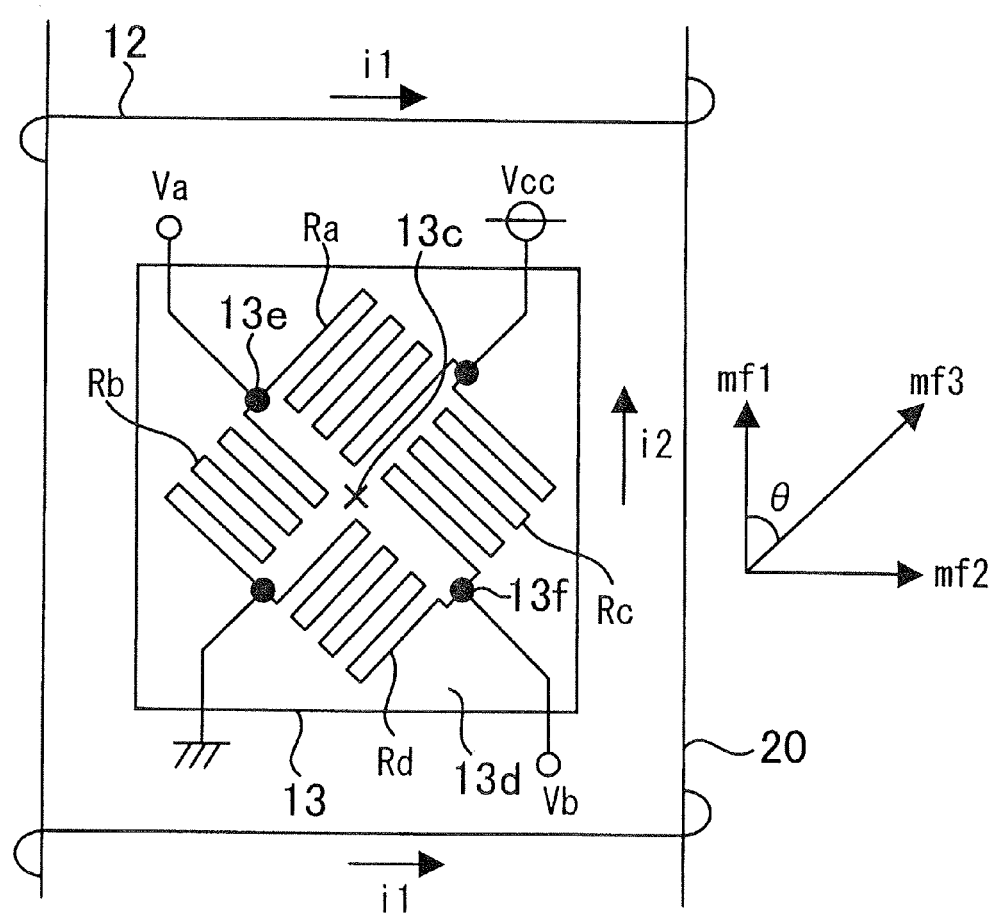
FIG. 5 is a diagram illustrating a layout of magnetoresistive elements of the sensor chip.

A current sensor 10 according to a first embodiment of the present invention is described below with reference to FIGS. 1-5. FIG. 1 is a diagram illustrating a plan view of the current sensor 10. FIG. 2 is a diagram illustrating a cross-sectional view taken along the line II-II in FIG. 1. FIG. 3 is a diagram illustrating a cross-sectional view taken along the line in FIG. 1. FIG. 4A is a diagram illustrating a positional relationship between a sensor chip 13 and a coil 12 of the current sensor 10, and FIG. 4B is a diagram illustrating a vertical cross-sectional view of the sensor chip 13. FIG. 5 is a diagram illustrating a layout of magnetoresistive elements Ra-Rd and a magnetic vector.

As shown in FIGS. 1 and 2, the current sensor 10 includes a substrate 11, a coil 12, the sensor chip 13, a circuit chip 14, and a casing 15. The sensor chip 13 and the circuit chip 14 are attached to a front surface of the substrate 11. As shown in FIG. 3, the substrate 11 and the coil 12 are accommodated in the casing 15. The casing 15 is attached to a busbar 20 through which a target current i2 to be detected flows. According to the first embodiment, as shown in FIG. 2, the busbar 20 has a plate-like shape, and the current sensor 10 is attached to a surface of the busbar 20. The coil 12 is formed from multiple turns of a wire made of a conductive material such as copper. The coil 12 is rectangular in vertical cross-section.

The busbar 20 is connected to a battery mounted on a vehicle. The target current i2 is supplied from the battery to each part of the vehicle through the busbar 20. Further, the battery is connected to an alternator through the busbar 20. A charging current is supplied to the battery from the alternator through the busbar 20. That is, the direction of the target current i2 flowing through the busbar 20 changes by 180 degrees depending on whether the battery is charged or discharged.

The sensor chip 13 produces a voltage corresponding to a magnitude of the target current i2. The coil 12 applies a bias magnetic field to the sensor chip 13. The circuit chip 14 performs processing, such as amplification, on the voltage produced by the sensor chip 13 and outputs the processed voltage to an electronic control unit (ECU).

As shown in FIG. 4A, the sensor chip 13 is located inside the coil 12 in such a manner that a center 13$c$ of the sensor chip 13 coincides with a center 12$c$ of the coil 12. The sensor chip 13 has a substrate 13$a$ and an element region 13$b$ formed on a surface of the substrate 13$a$. As shown in FIG. 4B, the sensor chip 13 and the coil 12 are positioned relative to each other in such a manner that the center axis 12$a$ of the coil 12 passes through the element region 13$b$ of the sensor chip 13. In FIGS. 4A and 4B, a reference 12$b$ denotes a center of the coil 12 in a longitudinal direction of the coil 12.

The magnetoresistive elements Ra-Rd are formed in the element region 13$b$ of the sensor chip 13. The magnetoresistive elements Ra-Rd are connected to form a bridge circuit, as shown in FIG. 5. The magnetoresistive elements Ra-Rd are symmetrically arranged with respect to the center 13$c$ of the sensor chip 13. Each of the magnetoresistive elements Ra-Rd is formed by patterning a ferromagnetic magnetoresistive thin film in a meander. An easy magnetization axis of each of the magnetoresistive elements Ra-Rd forms an angle of 45 degrees with a direction of a bias magnetic field mf1 and a direction of a magnetic filed mf2. As it is well known, an easy magnetization axis represents a crystal orientation in which a magnetic member having a crystal magnetic anisotropy is likely to be easily magnetized. The sensor chip 13 is positioned relative to the coil 12 so that a plane 13$d$ including the easy magnetization axis can be parallel to a plane including the center axis 12$a$ of the coil 12.

As shown in FIGS. 1 and 5, when the target current i2 flows through the busbar 20, the magnetic filed mf2 is generated around the busbar 20. The direction of the magnetic field mf2 is perpendicular to the direction of the target current i2. When a bias current i1 flows through the coil 12, the bias magnetic field mf1 is generated around the coil 12. The direction of the bias magnetic field mf1 is perpendicular to the direction of the bias current i1. The bias magnetic field mf1 and the magnetic filed mf2 are applied to the sensor chip 13.

Thus, a combined magnetic filed mf3 of the bias magnetic field mf1 and the magnetic filed mf2 is applied to the magnetoresistive elements Ra-Rd. When the target current i2 changes, the magnitude of the magnetic vector of the magnetic filed mf2 changes. As a result, the magnitude and the direction of the magnetic vector of the combined magnetic filed mf3 change. That is, an angle θ formed between the magnetic vector of the combined magnetic filed mf3 and the magnetic vector of the bias magnetic filed mf1 changes. The output voltage of the sensor chip 13 periodically changes according to the change in the angle θ.

Figure 6:
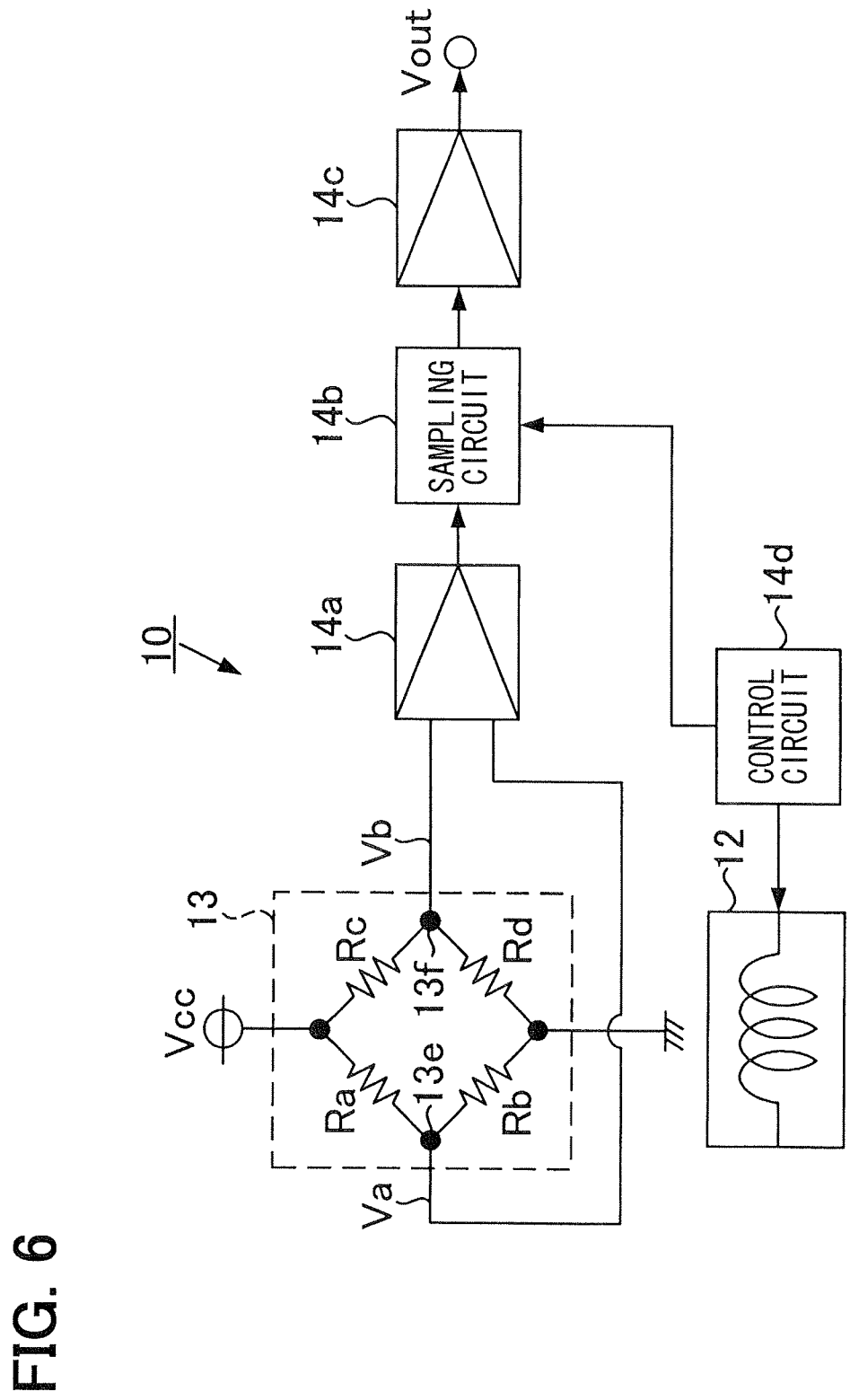
FIG. 6 is a block diagram of the current sensor.

The circuit chip 14 is described in detail below with reference to FIG. 6. The circuit chip 14 includes a first differential amplifier circuit 14$a$, a sampling circuit 14$b$, a second differential amplifier circuit 14$c$, and a current control circuit 14$d$. The first differential amplifier circuit 14$a$, the sampling circuit 14$b$, and the second differential amplifier circuit 14$c$ form an output circuit.

Two midpoints 13$e$ and 13$f$ of the bridge circuit constructed with the magnetoresistive elements Ra-Rd are connected to the first differential amplifier circuit 14$a$. The first differential amplifier circuit 14$a$ amplifies a difference between a voltage Va at the midpoint 13$e$ and a voltage Vb at the midpoint 13$f$. An output voltage of the first differential amplifier circuit 14$a$ is given as follows: $\Delta R \cdot \sin 2\theta \cdot Vcc/2R$, where R represents a combined resistance of the magnetoresistive elements Ra-Rd, $\Delta R$ represents a change in the combined resistance, and Vcc represents a voltage applied to the bridge circuit.

Figure 7:
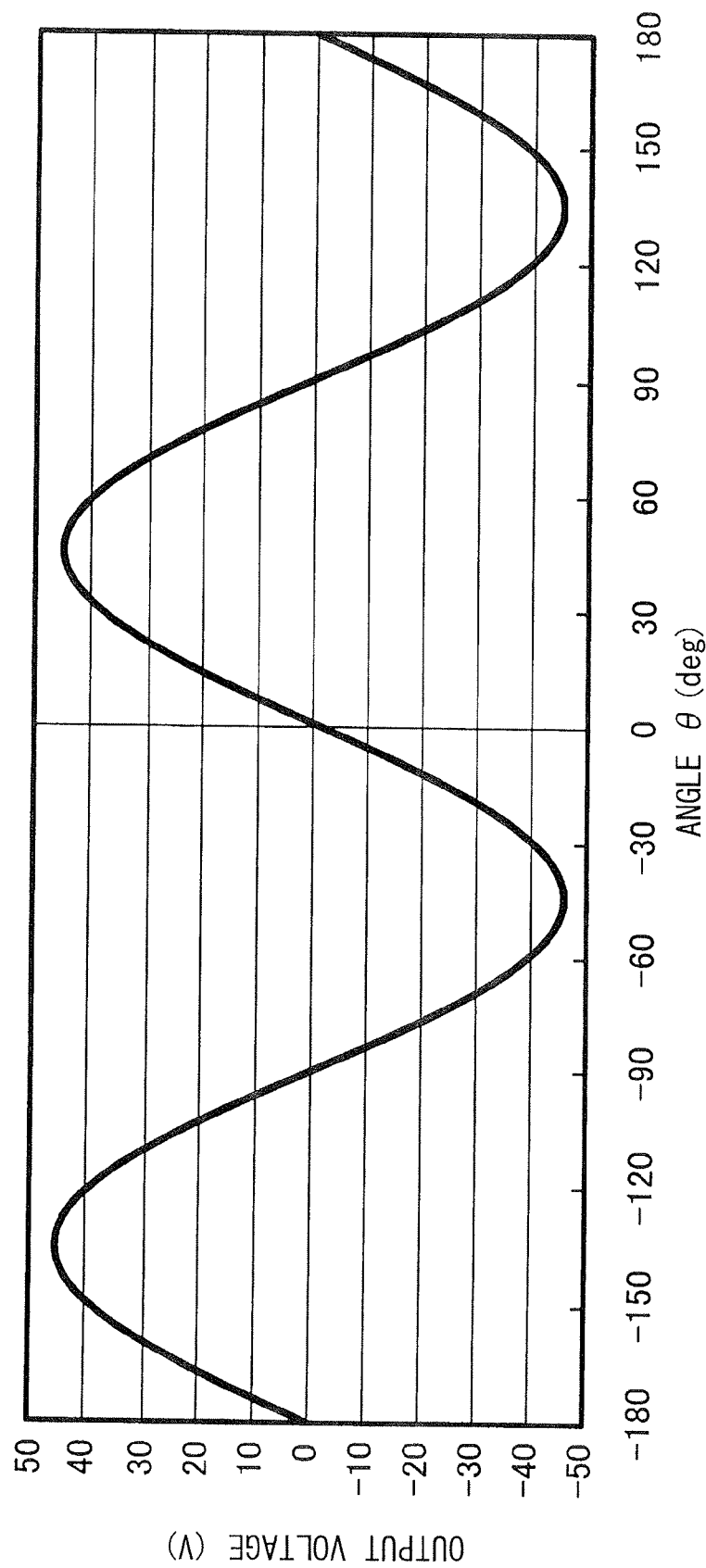
FIG. 7 is a diagram illustrating an output voltage of a first differential amplifier circuit of the current sensor.

As shown in FIG. 7, the output voltage of the first differential amplifier circuit 14$a$ is sinusoidal and changes periodically with a period of 180 degrees with respect to the angle θ from −180 degrees to +180 degrees. In an example shown in FIG. 7, the maximum value of the output voltage of the first differential amplifier circuit 14$a$ is 45 mV, and the minimum value of the output voltage of the first differential amplifier circuit 14$a$ is −45 mV.

Figure 8:
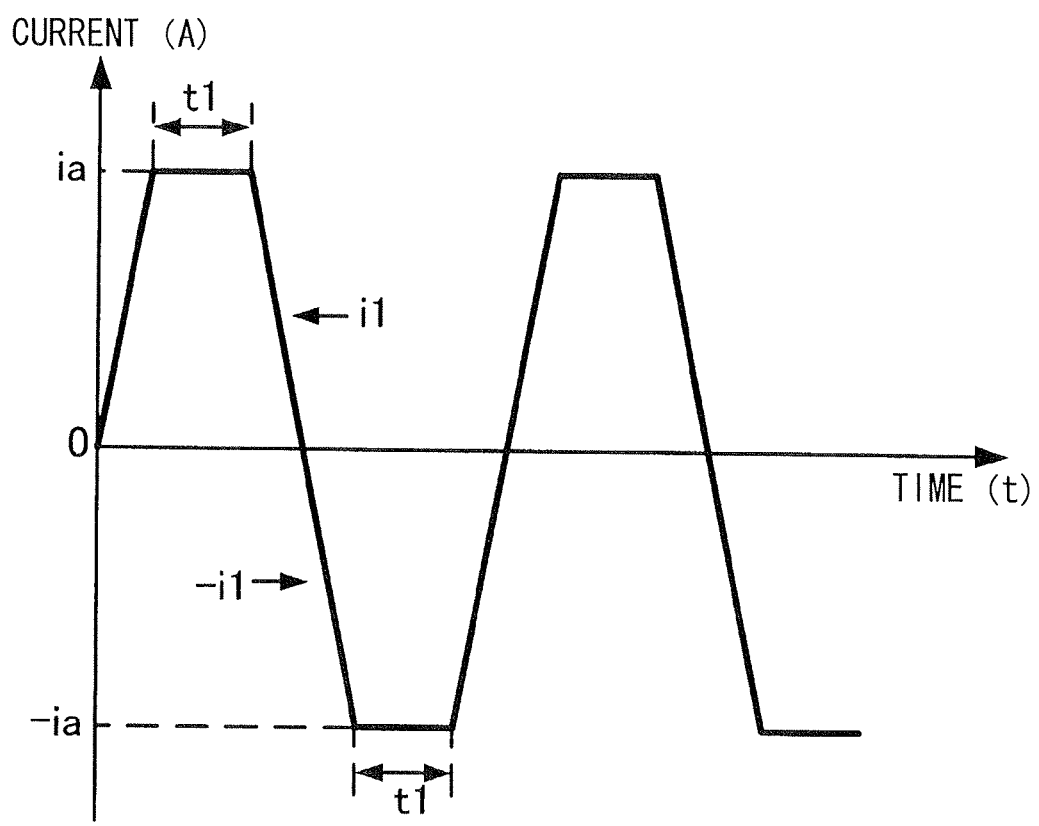
FIG. 8 is a diagram illustrating an output current of a current control circuit of the current sensor.

The current control circuit 14$d$ applies the bias current i1 to the coil 12. As shown in FIG. 8, the bias current i1 periodically changes in polarity.

The bias current i1 has the maximum value ia and the minimum value −ia. Each of the maximum value ia and the minimum value −ia lasts for a predetermined time length t1 so that the bias current i1 can have a square waveform having a first flat portion corresponding to the maximum value ia and a second flat portion corresponding to the minimum value −ia.

When the polarity of the bias current i1 applied by the current control circuit 14$d$ to the coil 12 is reversed, the direction of the bias magnetic field mf1 generated by the coil 12 is reversed accordingly. That is, the deflection angle θ of the magnetic vector of the combined magnetic field mf3 is reversed by 180 degrees.

The sampling circuit 14$b$ samples and holds a first voltage V and a second voltage −V. The first voltage V is outputted to the sampling circuit 14$b$ from the first differential amplifier circuit 14$a$ during a first time period where the bias current i1 has the maximum value ia. The second voltage −V is outputted to the sampling circuit 14$b$ from the first differential amplifier circuit 14$a$ during a second time period where the bias current i1 has the minimum value −ia. A sampling period of the sampling circuit 14$b$ is much smaller than the time length t1.

As mentioned above, each of the maximum value ia and the minimum value −ia lasts for the predetermined time length t1. The sampling circuit 14$b$ samples the output voltage of the first differential amplifier circuit 14$a$ during a period of time corresponding to the predetermined time length t1. That is, the sampling circuit 14b samples the output voltage of the first differential amplifier circuit 14a, when the bias current i1 applied to the coil 12 is kept constant at the maximum value ia or the minimum value −ia. In such an approach, the output voltage of the first differential amplifier circuit 14a can be sampled accurately.

Figure 9:
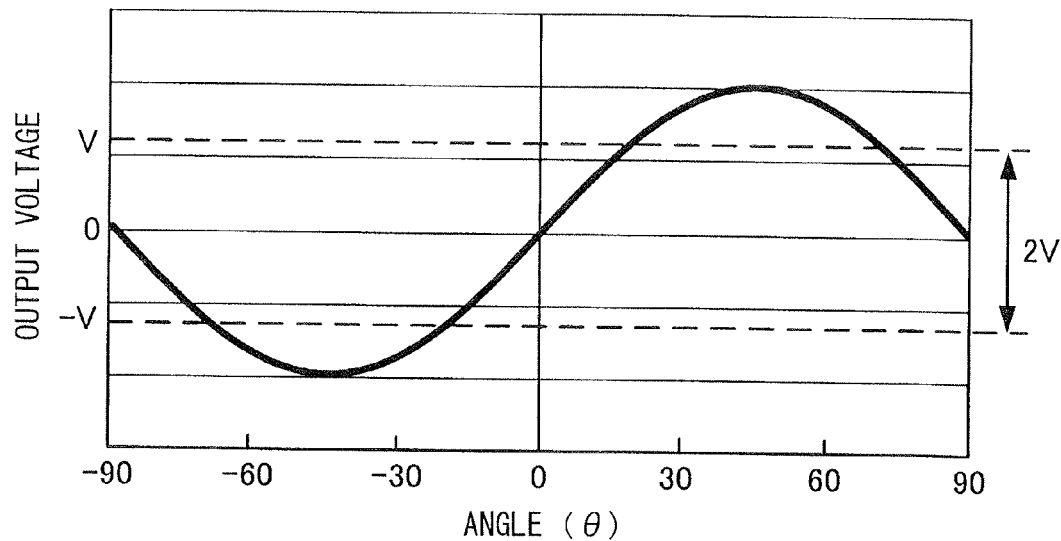
FIG. 9 is a diagram illustrating an output voltage of a second differential amplifier circuit of the current sensor.
Figure 10:
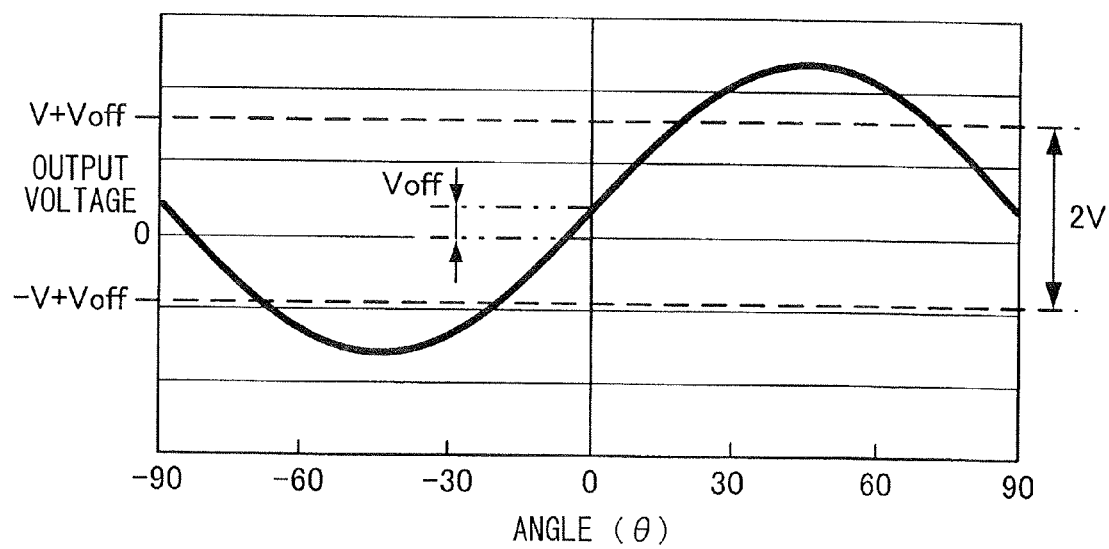
FIG. 10 is a diagram illustrating the output voltage of the second differential amplifier circuit when an offset occurs.

The second differential amplifier circuit 14c amplifies a difference 2V (=V−(−V)) between the first voltage V and the second voltage −V that are held by the sampling circuit 14b. FIG. 9 illustrates an output voltage of the second differential amplifier circuit 14c in a normal condition. FIG. 10 illustrates the output voltage of the second differential amplifier circuit 14c in an abnormal condition where an offset Voff occurs in the output voltage of the sensor chip 13 due to, for example, age deterioration of the sensor chip 13.

In the case of FIG. 10, the voltage (V+Voff) and the voltage (−V+Voff) are inputted to the first differential amplifier circuit 14a. Therefore, the output voltage of the first differential amplifier circuit 14a becomes 2V (=(V+Voff)−(−V+Voff)). Thus, the offset Voff is cancelled.

Figure 11:
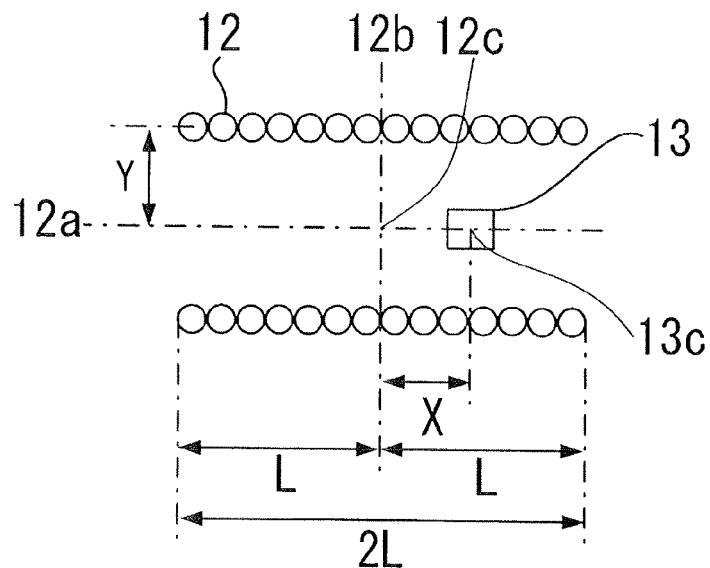
FIG. 11 is a diagram illustrating how an experiment was conducted by the inventors.
Figure 12:
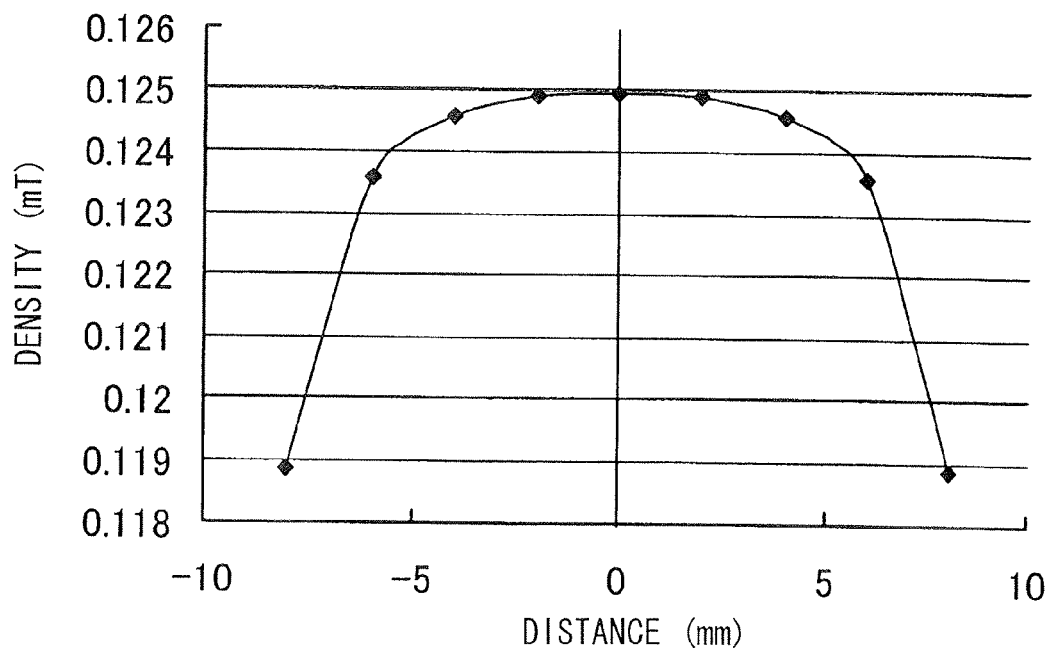
FIG. 12 is a diagram illustrating a result of the experiment.

The present inventors conducted an experiment to measure a relationship between the position of the center 13c of the sensor chip 13 and the magnitude of the bias magnetic field mf1 applied to the sensor chip 13. FIG. 11 is a diagram illustrating how the experiment was conducted. FIG. 12 is a diagram illustrating a result of the experiment.

The experiment was conducted under the following conditions. The coil 12 is made of copper. The of turns of the coil 12 is 1000. The radius Y of the coil 12 is 1 mm. The entire length 2L of the coil 12 is 20 mm. In an initial state, the sensor chip 13 is positioned so that the center 13c of the sensor chip 13 coincides with the center 12c of the coil 12. Under these conditions, the magnetic flux density of the bias magnetic field mf1 applied by the coil 12 to the sensor chip 13 was measured while moving the sensor chip 13 along the center axis 12a of the coil 12.

As can be seen from FIG. 12, when the sensor chip 13 is positioned relative to the coil 12 so that the center 13c of the sensor chip 13 can coincide with the center 12c of the coil 12, the magnetic flux density of the bias magnetic field mf1 becomes a maximum. Further, the result of the experiment exhibits shows that the magnetic flux density of the bias magnetic field mf1 is almost equal to the maximum, when a distance X between the center 13c of the sensor chip 13 and the center 12c of the coil 12 is less than about 5 mm.

That is, the magnetic flux density of the bias magnetic field mf1 can become almost maximum, when the distance X between the center 13c of the sensor chip 13 and the center 12c of the coil 12 is within a range of about plus or minus 5 mm in the longitudinal direction of the coil 12 along the center axis 12a of the coil 12.

Advantages of the first embodiment can be summarized as follows.

The second differential amplifier circuit 14c outputs the difference between the first voltage V and the second voltage −V. The first voltage V is generated by the sensor chip 13, when the bias current i1 having the maximum value is flows through the coil 12. The second voltage −V is generated by the sensor chip 13, when the bias current i1 having the minimum value −ia flows through the coil 12. In such an approach, even when an offset Voff occurs in the output voltage of the sensor chip 13, the effect of the offset Voff can be removed. Thus, a reduction in accuracy with which the target current i2 is detected can be prevented.

The sensor chip 13 is located inside the coil 12. In such an approach, the magnetic flux density of the bias magnetic field mf1 applied to the magnetoresistive elements Ra-Rd is increased so that sensitivity with which the target current i2 is detected can be improved. Further, since the sensor chip 13 is located inside the coil 12, the current sensor 10 can be reduced in size.

The sensor chip 13 is positioned relative to the coil 12 so that the plane 13d including the easy magnetization axis of the magnetoresistive elements Ra-Rd can be parallel to the plane including the center axis 12a of the coil 12. In such an approach, the bias magnetic field mf1 generated by the coil 12 can be equally applied to the magnetoresistive elements Ra-Rd. Thus, accuracy with which the target current i2 is detected can be improved.

The sensor chip 13 and the coil 12 are positioned relative to each other in such a manner that the center axis 12a of the coil 12 passes through the element region 13b of the sensor chip 13. In such an approach, the bias magnetic field mf1 generated by the coil 12 can be more equally applied to the magnetoresistive elements Ra-Rd. Thus, accuracy with which the target current i2 is detected can be more improved.

The sensor chip 13 is positioned relative to the coil 12 so that the center 13c of the sensor chip 13 can coincide with the center 12c of the coil 12. In such an approach, a lot of parallel magnetic fluxes of the bias magnetic field mf1 can be equally applied to the magnetoresistive elements Ra-Rd. Thus, the sensitivity and the accuracy with which the target current i2 is detected can be more improved.

The second differential amplifier circuit 14c outputs the difference between the voltages that are outputted when the bias current i1 has the maximum positive value +ia and the minimum negative value −ia. In such an approach, the sensitivity with which the target current i2 is detected can be improved.

Second Embodiment

Figure 13:
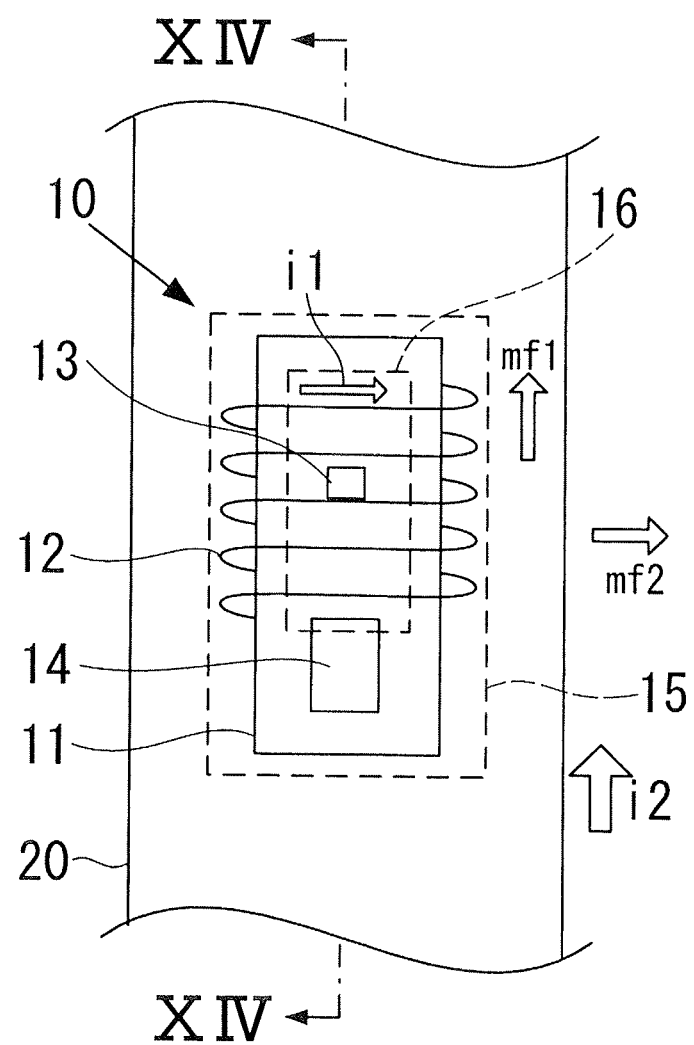
FIG. 13 is a diagram illustrating a plan view of a current sensor according to a second embodiment of the present invention.
Figure 14:
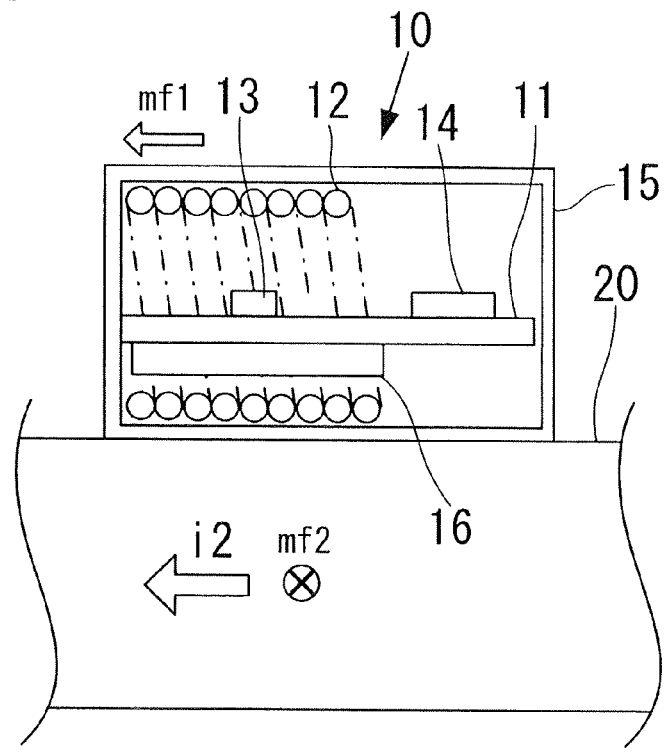
FIG. 14 is a diagram illustrating a cross-sectional view taken along the line XIV-XIV in FIG. 13.

A current sensor 10 according to a second embodiment of the present invention is described below with reference to FIGS. 13 and 14. FIG. 13 is a diagram illustrating a plan view of the current sensor 10. FIG. 14 is a diagram illustrating a cross-sectional view taken along the line XIV-XIV in FIG. 13. A difference of the second embodiment from the first embodiment is as follows.

According to the second embodiment, a core 16 made of a magnetic material is attached to a back surface of the substrate 11 and thus located inside the coil 12. In an example shown in FIGS. 13 and 14, the core 16 has a plate-like shape. Alternatively, the core 16 can have a circular cylindrical shape, for example. The core 16, which is located inside the coil 12, increases the magnetic flux density of the bias magnetic field mf1 generated by the coil 12. Thus, the sensitivity with which the target current i2 is detected can be increased. The core 16 can be located outside the coil 12. The core 16 can be attached to the front surface of the substrate 11.

Third Embodiment

Figure 15:
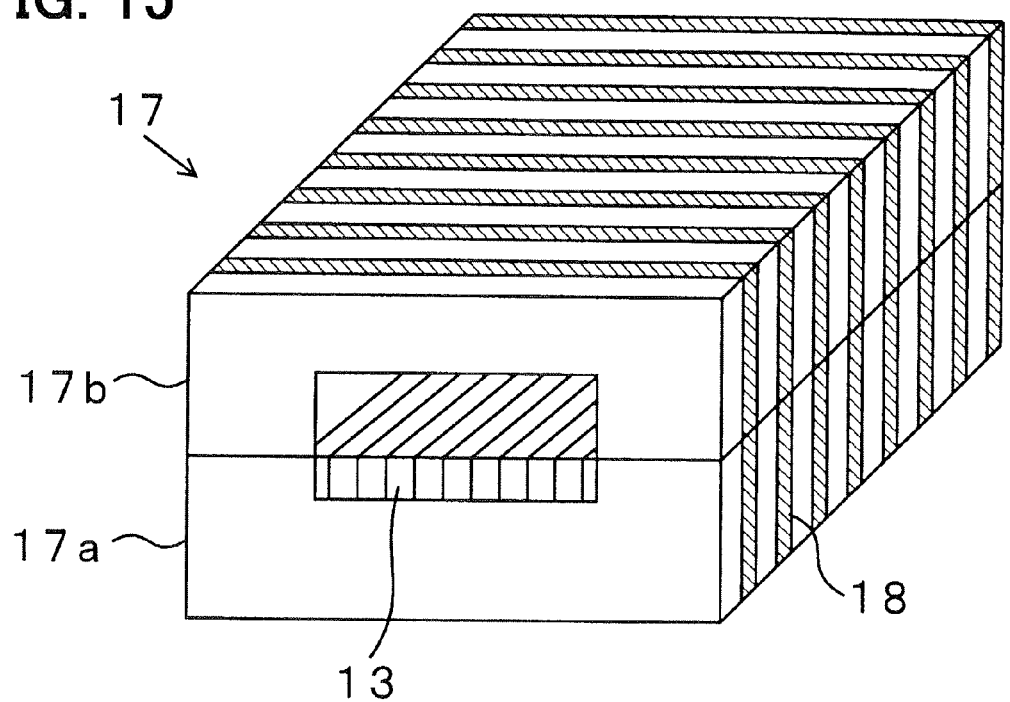
FIG. 15 is a diagram illustrating a perspective view of a sensor chip and a coil of a current sensor according to a third embodiment of the present invention.

A current sensor 10 according to a third embodiment of the present invention is described below with reference to FIG. 15. FIG. 15 is diagram illustrating a perspective view of a sensor chip 13 and a coil 12 of the current sensor 10. A difference of the third embodiment from the preceding embodiments is that the sensor chip 13 is formed by using a wafer level packaging technology.

Multiple sensor chips 13 are formed into a silicon wafer. Then, another silicon wafer serving as a cap is joined to the silicon wafer so that the sensor chips 13 can be covered with the other silicon wafer. Then, the silicon wafers are divided into individual wafer level packages (WLPs) 17. Specifically, as shown in FIG. 15, the WLP 17 has a main portion 17a and a cap portion 17b. The sensor chip 13 is formed in the main portion 17a, and the cap portion 17b is joined to the main portion 17a so that the sensor chip 13 can be covered with the cap portion 17b. A conductive pattern 18 serving as the coil 12 is formed on an outer surface of the main portion 17a and the cap portion 17b.

For example, the conductive pattern 18 can be formed by printing a conductive material on the outer surface. The inside of the WLP 17 is maintained under vacuum.

As described above, according to the third embodiment, the sensor chip 13 is formed by using a wafer level packaging technology. In such an approach, the sensor chip 13 can be manufactured efficiently.

Modifications

The embodiments described above can be modified in various ways, for example, as follows.

In the embodiments, the sensor chip 13 is located inside the coil 12. Alternatively, the sensor chip 13 can be located outside the coil 12, as long as the bias magnetic field mf1 can be applied to the sensor chip 13 so that the sensor chip 13 can detect the target current i2.

The coil 12 can be circular in vertical cross-section. The bias current i1 applied to the coil 12 can be an alternate current having a sinusoidal waveform. The casing 15 can be filled with a sealing material to increase air tightness. The coil 12 and the substrate 11 can be encapsulated with a sealing material and then directly fixed to the busbar 20 without using the casing 15.

In the embodiments, the current sensor 10 is configured to detect an electric current in a vehicle. The current sensor 10 can be configured to detect an electric current in a robot, an airplane, a train, a ship, an electrical apparatus, or the like.

Such changes and modifications are to be understood as being within the scope of the present invention as defined by the appended claims.

What is claimed is:

1. A current sensor comprising:
a sensor chip including a magnetoresistive element and adapted to be located near a current path where a target current flows;
a coil configured to apply a bias magnetic field to the magnetoresistive element;
a current control circuit configured to supply a bias current to the coil to cause the coil to generate the bias magnetic field, the bias current periodically changing in polarity; and
an output circuit configured to output a difference between a first voltage and a second voltage, wherein
the first voltage is generated by the magnetoresistive element, when the bias current flowing through the coil has a positive value,
the second voltage is generated by the magnetoresistive element, when the bias current flowing through the coil has a negative value,
the sensor chip is located inside the coil,
the target current is detected based on the difference between the first voltage and the second voltage,
the bias magnetic field is perpendicular to a magnetic field which is generated according to the target current flowing through the current path, and
an absolute value of the positive value is equal to an absolute value of the negative value.

2. The current sensor according to claim 1, wherein
the sensor chip and the coil are positioned relative to each other in such a manner that a first plane including an easy magnetization axis of the magnetoresistive element is parallel to a second plane including a center axis of the coil.

3. The current sensor according to claim 2, wherein
the sensor chip further includes a substrate having an element region where the magnetoresistive element is located, and
the sensor chip and the coil are positioned, relative to each other in such a manner that the center axis of the coil passes through the element region of the sensor chip.

4. The current sensor according to claim 3, wherein
the sensor chip and the coil are positioned relative to each other in such a manner that a center of the sensor chip coincides with a center of the coil.

5. The current sensor according to claim 1, further comprising:
a magnetic core located inside the coil.

6. The current sensor according to claim 1, wherein
the bias current changes in a range from the positive value to the negative value.

7. The current sensor according to claim 1, wherein
the bias current has the positive value continuously for a predetermined first time length,
the bias current has the negative value continuously for a predetermined second time length, and
a wavelength of the bias current has a first flat portion corresponding to the positive value and a second flat portion corresponding to the negative value.

8. The current sensor according to claim 1, further comprising:
a casing; and
a substrate, wherein
the sensor chip, the current control circuit, and the output circuit are mounted on the substrate,
the substrate and the coil are accommodated in the casing,
the current path is a busbar, and
the casing is adapted to be attached to the busbar to detect the target current.

* * * * *